US012768651B2

(12) United States Patent
Kazuno et al.

(10) Patent No.: US 12,768,651 B2
(45) Date of Patent: Oct. 20, 2026

(54) ELECTRONIC DEVICE

(71) Applicant: SEIKO EPSON CORPORATION, Tokyo (JP)

(72) Inventors: Masataka Kazuno, Kofu (JP); Kenji Yamamoto, Matsumoto (JP)

(73) Assignee: SEIKO EPSON CORPORATION (JP)

( * ) Notice: Subject to any disclaimer, the term of this patent is extended or adjusted under 35 U.S.C. 154(b) by 278 days.

(21) Appl. No.: 18/506,424

(22) Filed: Nov. 10, 2023

(65) Prior Publication Data

US 2024/0159534 A1 May 16, 2024

(30) Foreign Application Priority Data

Nov. 11, 2022 (JP) ................................ 2022-180884

(51) Int. Cl.

*G01C 19/5733* (2012.01)
*G01C 19/5783* (2012.01)
*H03H 9/05* (2006.01)
*H03H 9/10* (2006.01)
*H03H 9/215* (2006.01)

(52) U.S. Cl.

CPC ....... *G01C 19/5733* (2013.01); *H03H 9/0542* (2013.01); *H03H 9/0552* (2013.01); *H03H 9/105* (2013.01); *H03H 9/215* (2013.01)

(58) Field of Classification Search

None

See application file for complete search history.

(56) References Cited

U.S. PATENT DOCUMENTS

| | | | | |
|---|---|---|---|---|
| 5,038,613 A | | 8/1991 | Takenaka et al. | |
| 2009/0320593 A1* | | 12/2009 | Nakashio ........... | G01C 19/5663 73/504.15 |
| 2014/0217566 A1* | | 8/2014 | Goida ................. | H10W 90/811 257/676 |
| 2017/0115116 A1* | | 4/2017 | Ide ..................... | G01C 19/5635 |
| 2020/0072607 A1* | | 3/2020 | Mitani ............... | G01C 19/5755 |

(Continued)

FOREIGN PATENT DOCUMENTS

| | | |
|---|---|---|
| JP | H02-306111 A | 12/1990 |
| JP | 2010-101727 A | 5/2010 |

(Continued)

*Primary Examiner* — Stephen D Meier
*Assistant Examiner* — Ruben C Parco, Jr.
(74) *Attorney, Agent, or Firm* — Harness, Dickey & Pierce, P.L.C.

(57) ABSTRACT

An electronic device includes a substrate, a first electronic component mounted on the substrate and including a first vibrator element vibrating along a first plane along the substrate, a second electronic component mounted on the substrate and including a second vibrator element vibrating along a second plane crossing the first plane, a third electronic component mounted on the substrate and including a third vibrator element vibrating along a third plane crossing the first plane and the second plane, and a cap mounted on the substrate and covering the first electronic component, the second electronic component, and the third electronic component, wherein a resonance mode of the cap is not within vibration frequency bands of the second vibrator element and the third vibrator element in an operation temperature range.

3 Claims, 9 Drawing Sheets

(56) References Cited

U.S. PATENT DOCUMENTS

| | | | | |
|---|---|---|---|---|
| 2021/0123943 | A1* | 4/2021 | Sakuma .................. | G01P 15/08 |
| 2022/0084898 | A1 | 3/2022 | Kazuno et al. | |
| 2022/0085004 | A1 | 3/2022 | Kazuno et al. | |

FOREIGN PATENT DOCUMENTS

| | | | | | |
|---|---|---|---|---|---|
| JP | 2013-019826 | A | | 1/2013 | |
| JP | 2013210215 | A | * | 10/2013 | ............ G01P 15/125 |
| JP | 2022-046921 | A | | 3/2022 | |
| JP | 2022-046922 | A | | 3/2022 | |

* cited by examiner (VDDM=2.7 TO 3.6V, VDDI=1.65 TO 3.6V, GND=0V, Ta=−40°C TO +105°C)

| ITEM | CONDITION | STANDARD | | | UNIT |
|---|---|---|---|---|---|
| | | MIN | TYP | MAX | |
| DRIVE FREQUENCY | FIRST ANGULAR VELOCITY SENSOR 3z | 49.000 | 49.575 | 50.150 | kHz |
| | SECOND ANGULAR VELOCITY SENSOR 3x | 50.450 | 51.025 | 51.600 | kHz |
| | THIRD ANGULAR VELOCITY SENSOR 3y | 52.900 | 53.550 | 54.200 | kHz |
| | | | | | |

ELECTRONIC DEVICE

The present application is based on, and claims priority from JP Application Serial Number 2022-180884, filed Nov. 11, 2022, the disclosure of which is hereby incorporated by reference herein in its entirety.

BACKGROUND

1. Technical Field

The present disclosure relates to an electronic device.

2. Related Art

An electronic device disclosed in JP-A-2022-046922 includes a substrate, three angular velocity sensors mounted on the substrate, and a cap placed on the substrate to cover these three angular velocity sensors. Further, each angular velocity sensor has a vibrator element housed in a package.

Here, the resonance frequency of the cap changes with temperature. Accordingly, when the resonance frequency of the cap is close to the vibration frequency of the vibrator element at a particular temperature, the cap and the vibrator element resonate and an unnecessary vibration is generated in the vibrator element. Thereby, outputs of the angular velocity sensors fluctuate and the characteristics of the electronic device, e.g., the temperature drift characteristics are degraded. That is, the outputs from the angular velocity sensors during rest easily fluctuate with temperature.

SUMMARY

An electronic device according to an aspect of the present disclosure includes a substrate, a first electronic component mounted on the substrate and including a first vibrator element vibrating along a first plane along the substrate, a second electronic component mounted on the substrate and including a second vibrator element vibrating along a second plane crossing the first plane, a third electronic component mounted on the substrate and including a third vibrator element vibrating along a third plane crossing the first plane and the second plane, and a cap mounted on the substrate and covering the first electronic component, the second electronic component, and the third electronic component, wherein a resonance mode of the cap is not within vibration frequency bands of the second vibrator element and the third vibrator element in an operation temperature range.

DESCRIPTION OF EMBODIMENTS

As below, an electronic device of the present disclosure will be explained in detail based on embodiments shown in the accompanying drawings. Note that, for convenience of explanation, in the respective drawings except FIGS. 4 to 6, three axes orthogonal to one another are shown as an X-axis, a Y-axis, and a Z-axis. Directions parallel to the X-axis are also referred to as "X-axis directions", directions parallel to the Y-axis are also referred to as "Y-axis directions", and directions parallel to the Z-axis are also referred to as "Z-axis directions". Further, the Z-axis extends along a vertical direction and the pointer side is also referred to as "upper" and the opposite side is also referred to as "lower". Furthermore, in FIGS. 4 to 6, three axes orthogonal to one another are shown as an A-axis, a B-axis, and a C-axis. Directions parallel to the A-axis are also referred to as "A-axis directions", directions parallel to the B-axis are also referred to as "B-axis directions", and directions parallel to the C-axis are also referred to as "C-axis directions". Note that the X, Y, Z coordinate system is set for an electronic device and the A, B, C coordinate system is set for an angular velocity sensor.

First Embodiment

Figure 1:
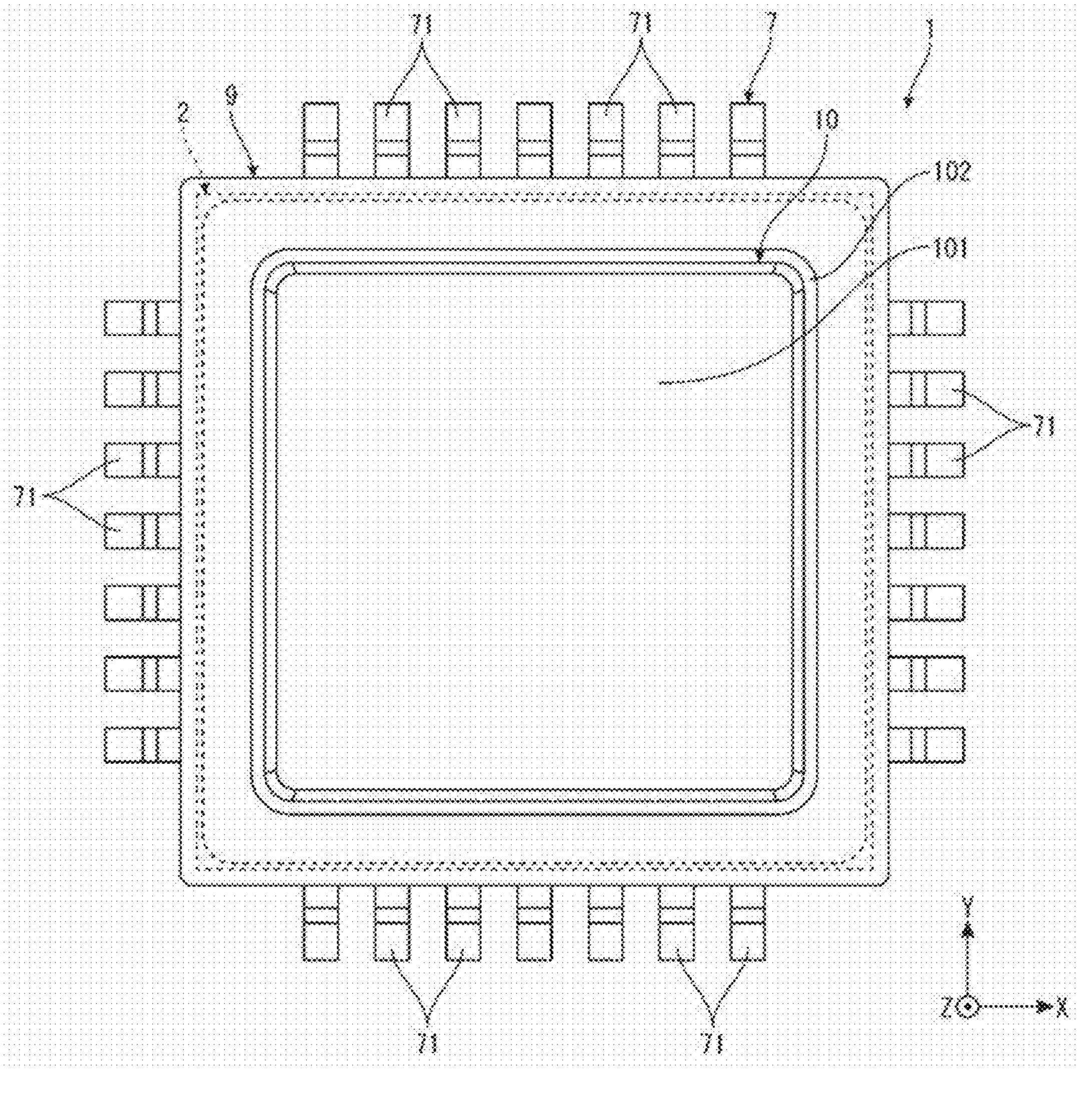
FIG. 1 is a top view showing an electronic device according to a first embodiment.
Figure 2:
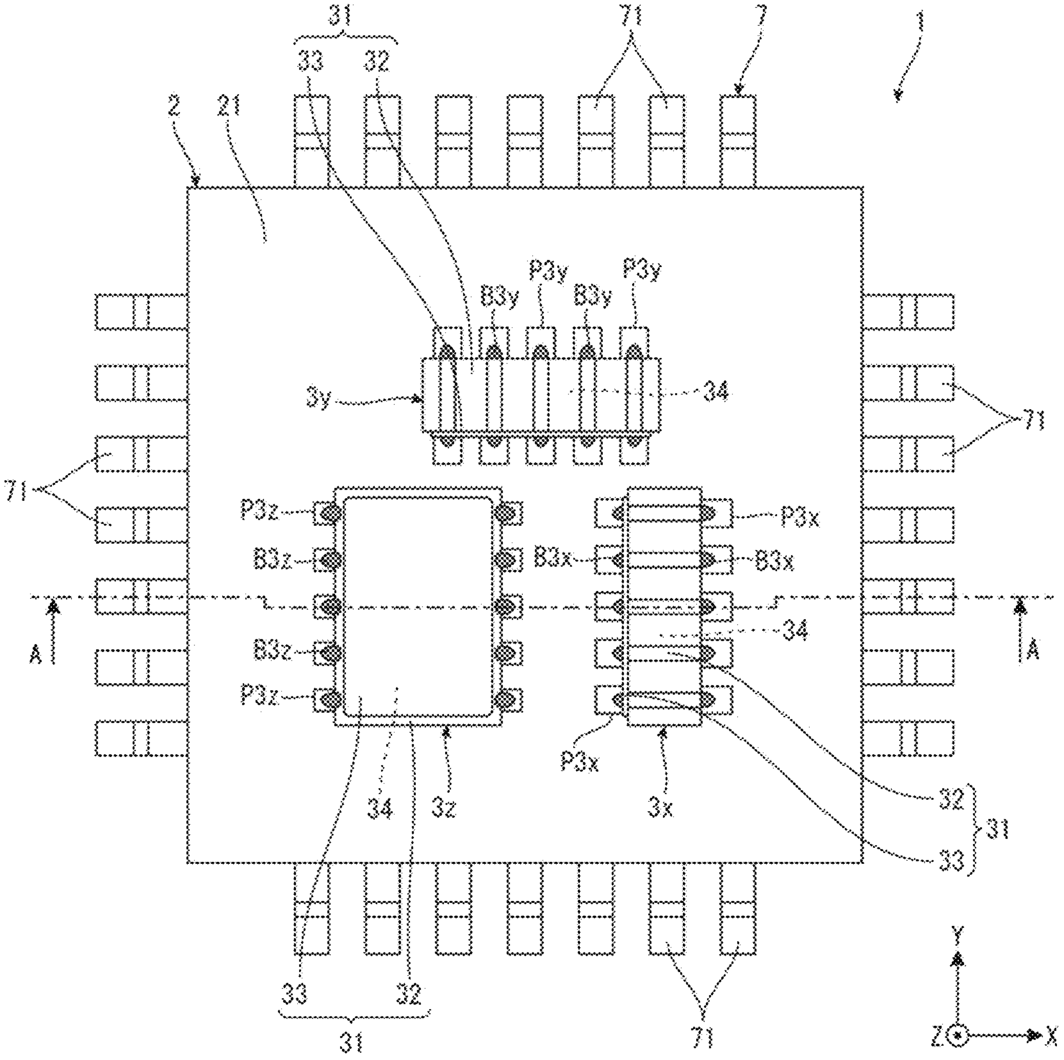
FIG. 2 is a top view of the electronic device in FIG. 1 from which a cap and a mold portion are omitted.
Figure 3:
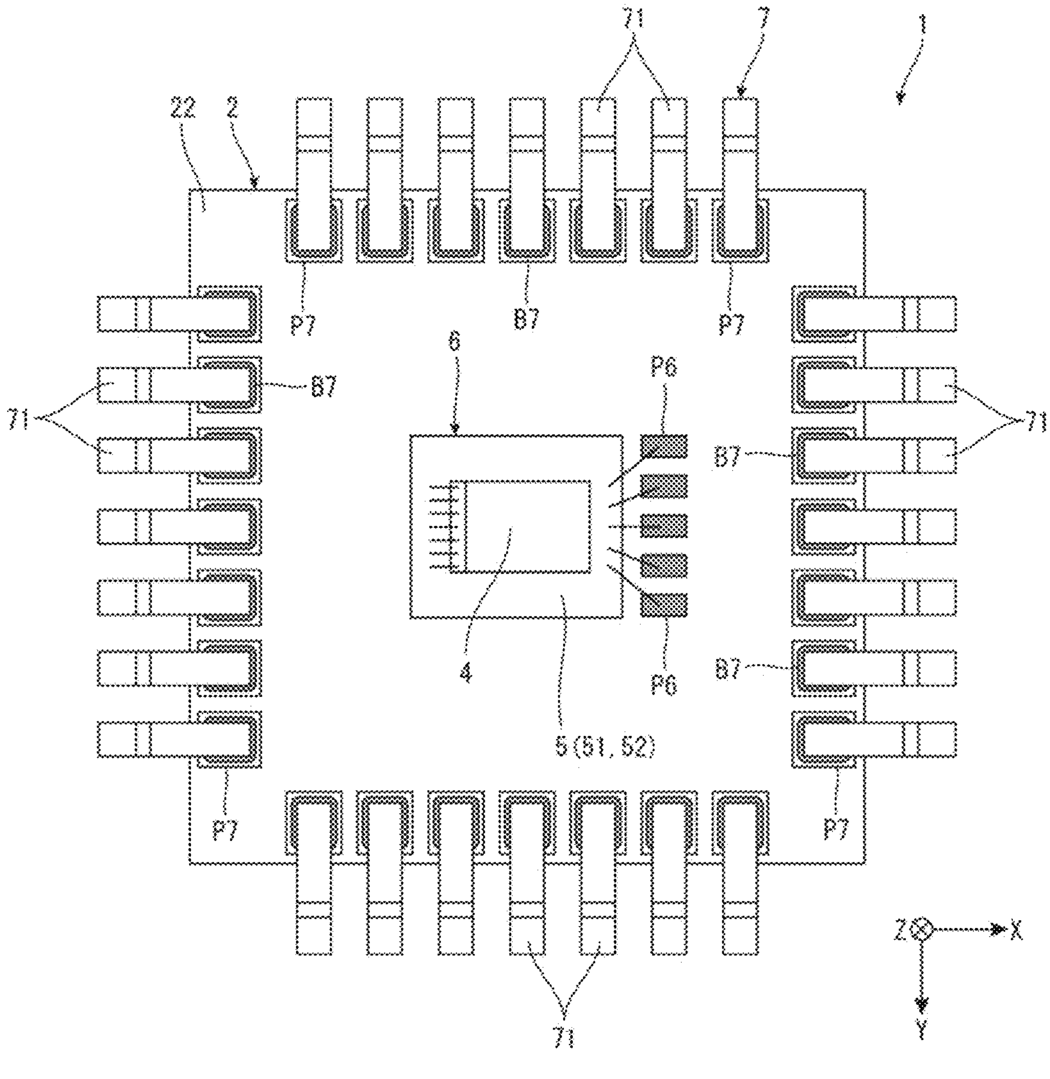
FIG. 3 is a bottom view of the electronic device in FIG. 1.
Figure 4:
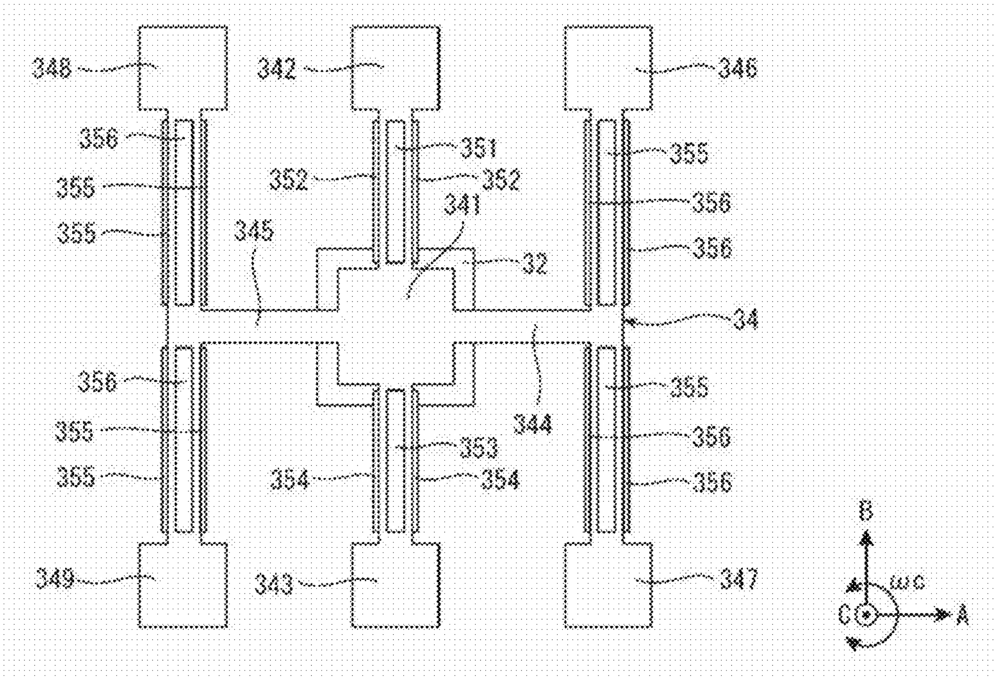
FIG. 4 is a plan view showing a vibrator element.
Figure 5:
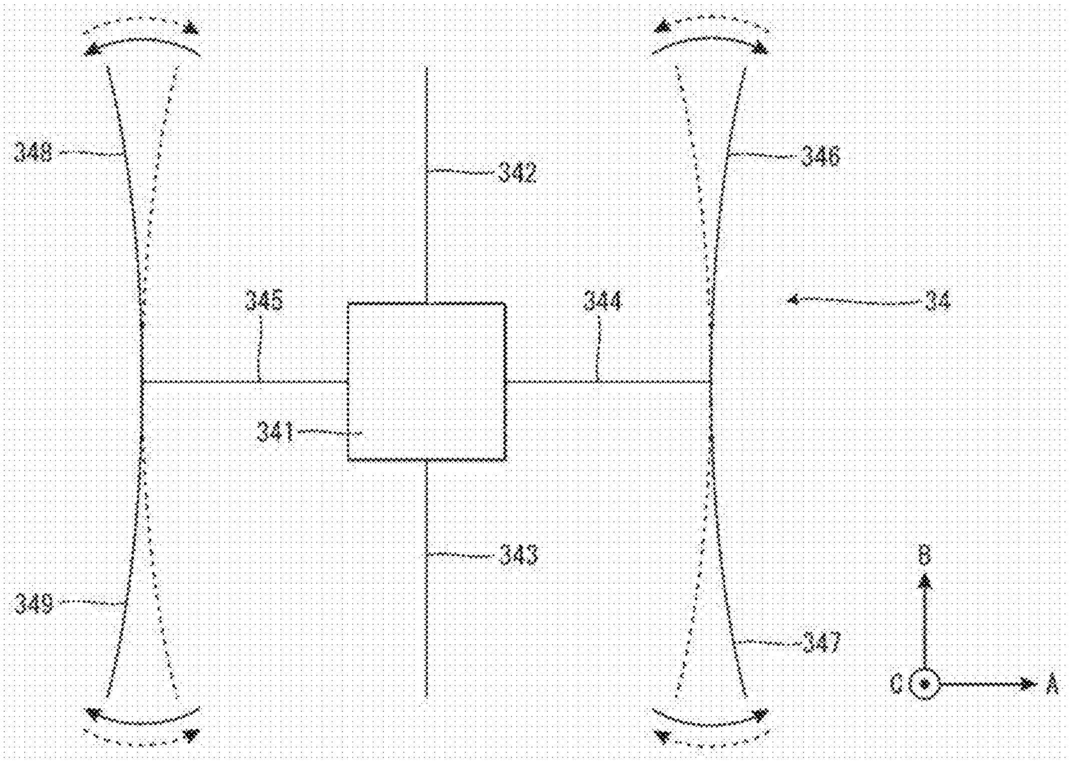
FIG. 5 is a diagram showing a drive state of the vibrator element.
Figure 6:
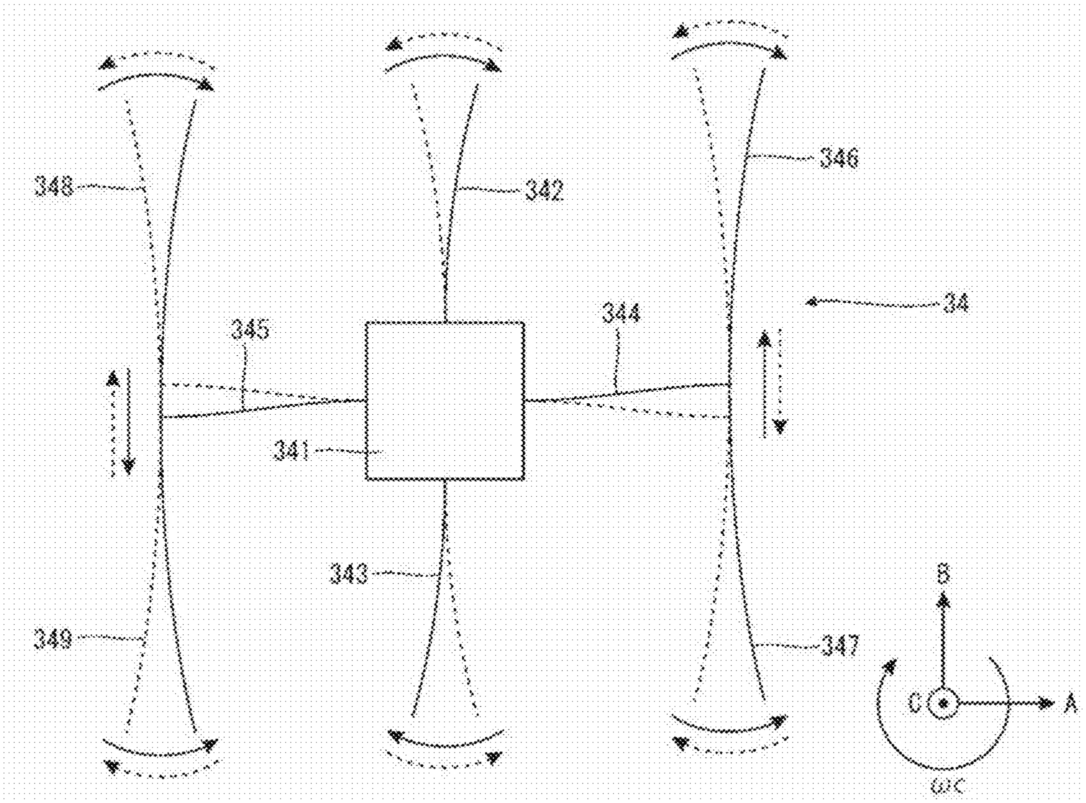
FIG. 6 is a diagram showing a drive state of the vibrator element.
Figure 7:
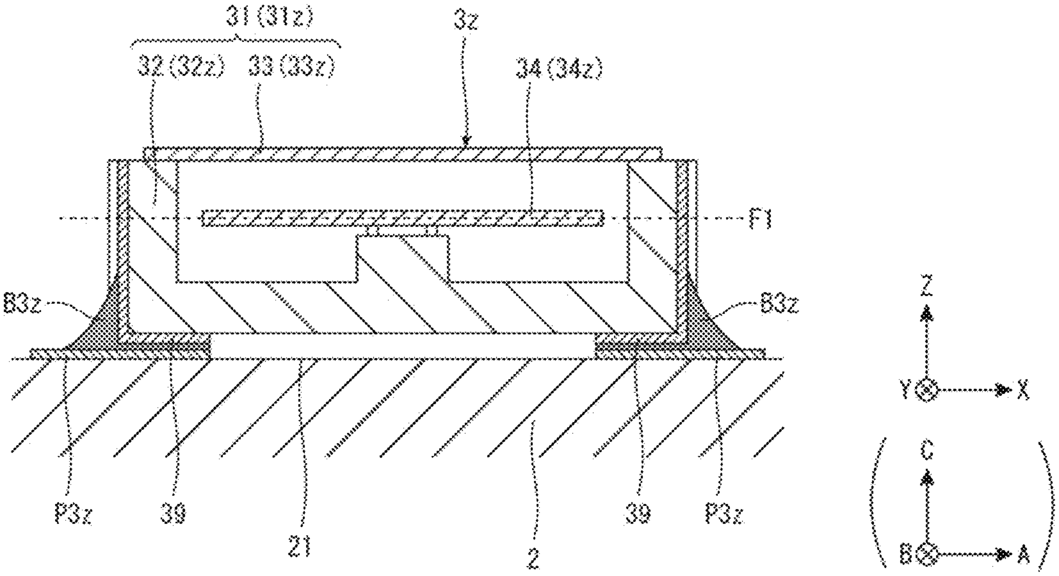
FIG. 7 is a sectional view of a first angular velocity sensor.
Figure 8:
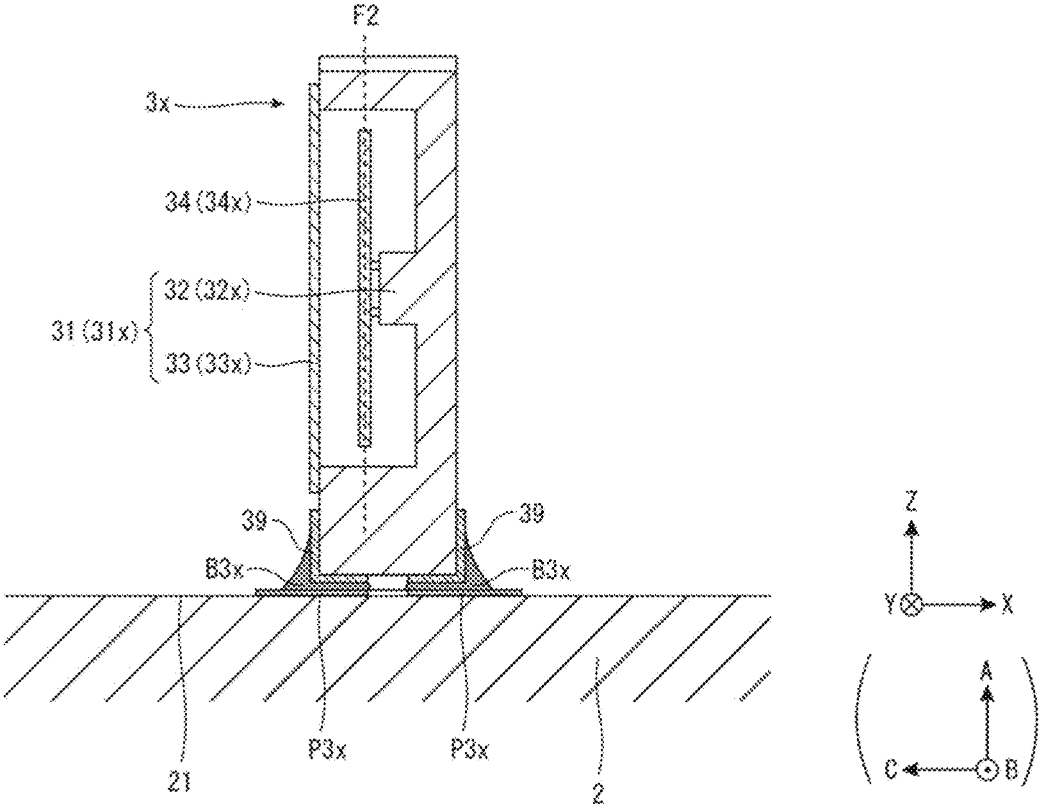
FIG. 8 is a sectional view of a second angular velocity sensor.
Figure 9:
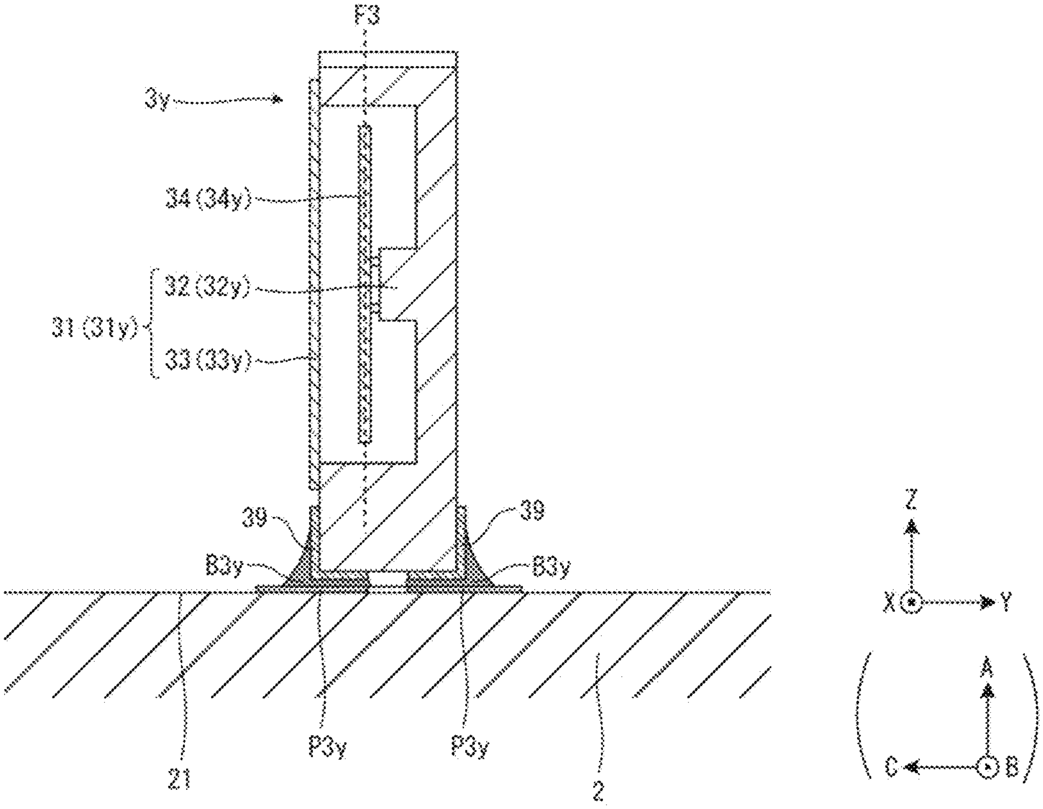
FIG. 9 is a sectional view of a third angular velocity sensor.
Figures 10, 11:
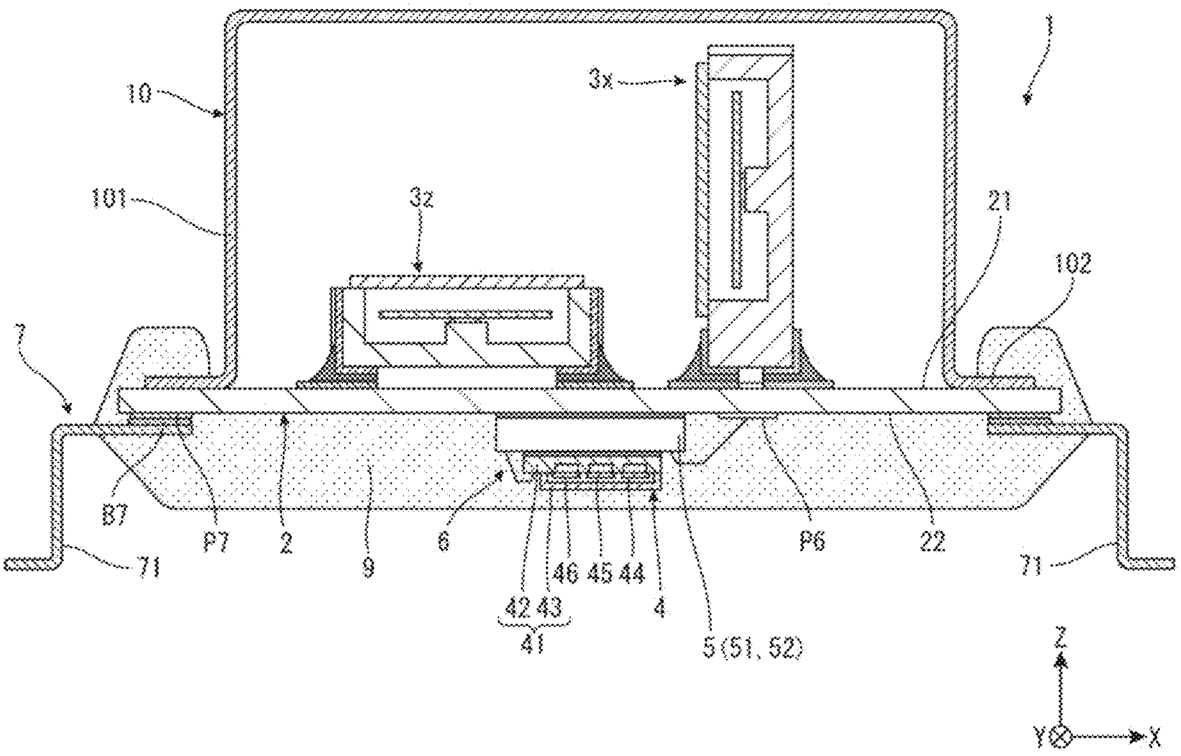
FIG. 10 is a sectional view along line A-A in FIG. 2.
FIG. 11 is a table showing specifications of the angular velocity sensors.
Figure 12:
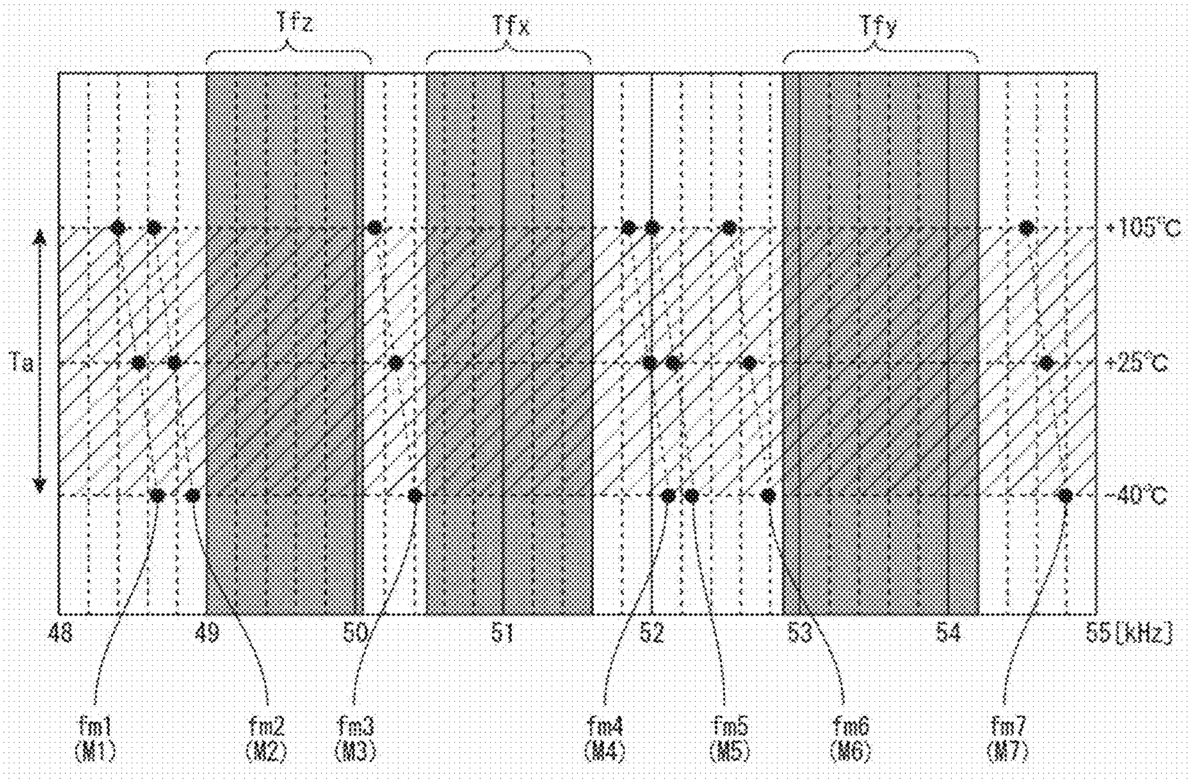
FIG. 12 is a graph showing relationships between an operation temperature range of the respective angular velocity sensors and vibration modes of the cap.
Figure 13:
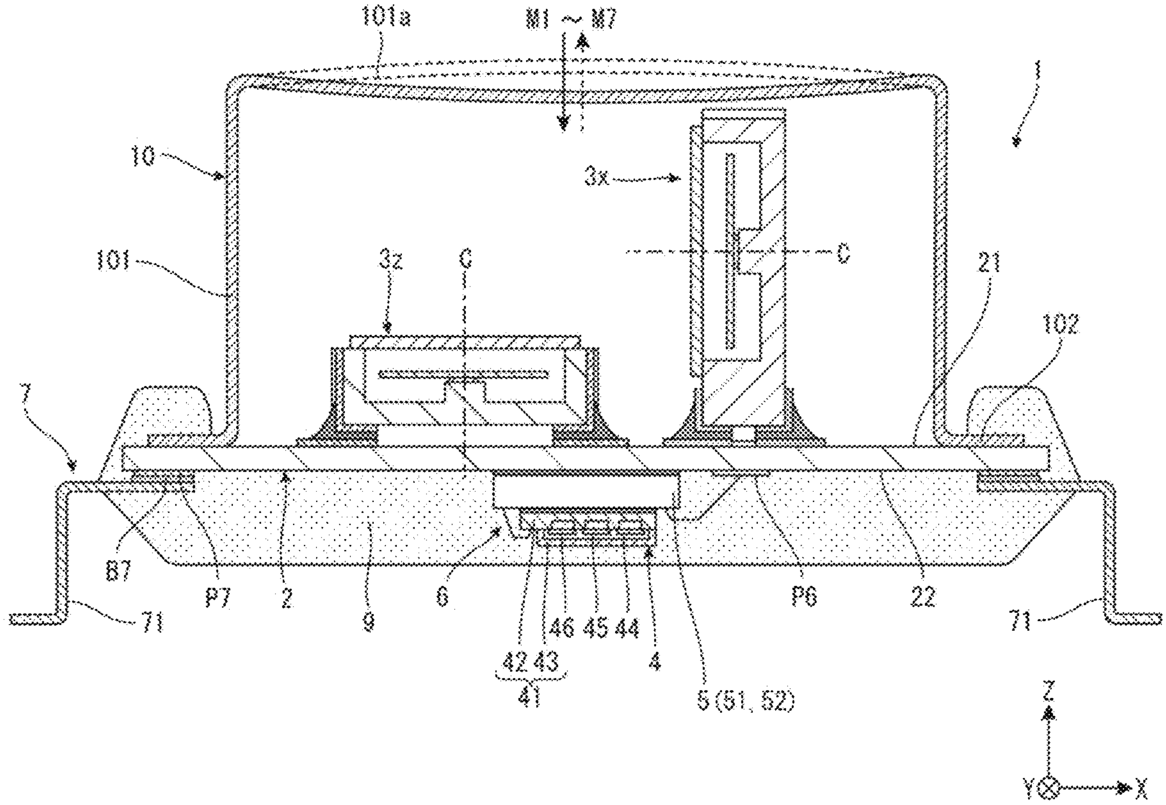
FIG. 13 is a sectional view showing resonance modes of the cap.
Figure 14:
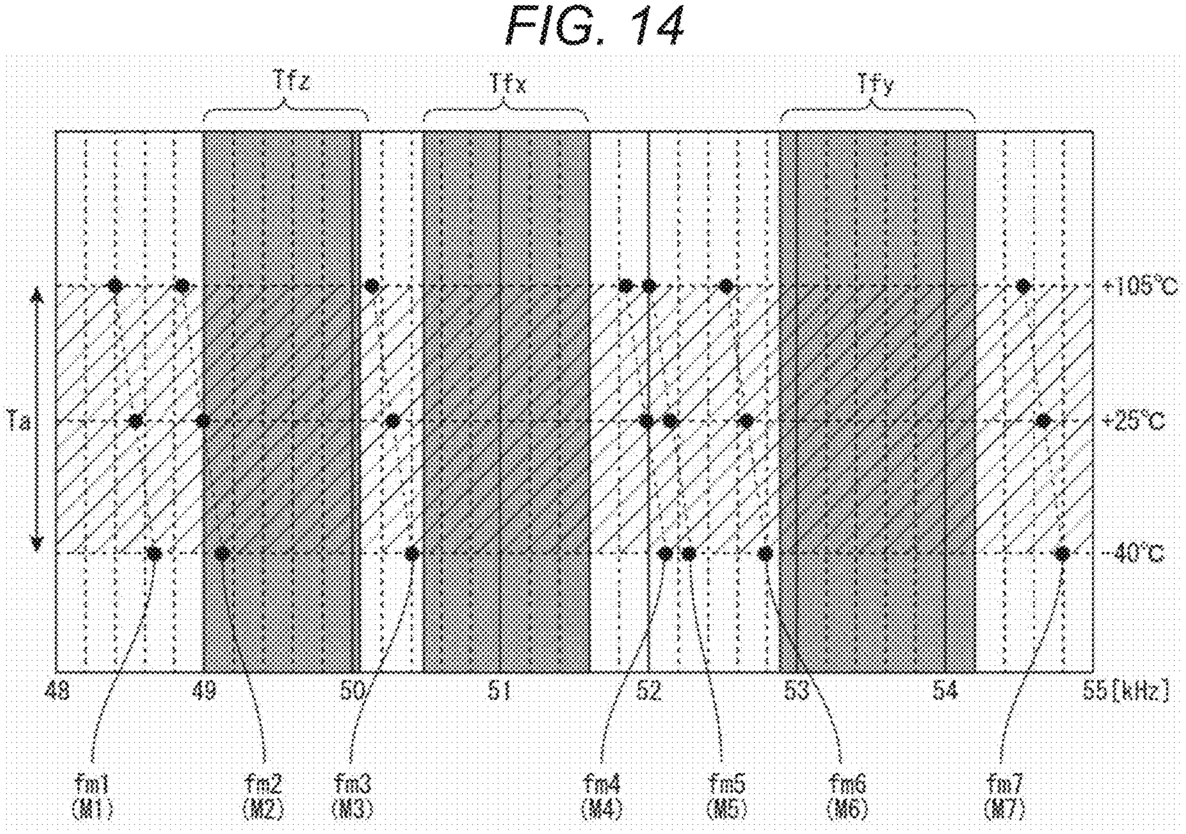
FIG. 14 is a graph showing relationships between the operation temperature range of the respective angular velocity sensors and vibration modes of the cap.

FIG. 1 is a top view showing an electronic device according to a first embodiment. FIG. 2 is a top view of the electronic device in FIG. 1 from which a cap and a mold portion are omitted. FIG. 3 is a bottom view of the electronic device in FIG. 1. FIG. 4 is a plan view showing a vibrator element. FIGS. 5 and 6 are diagrams showing drive states of the vibrator element. FIG. 7 is a sectional view of a first angular velocity sensor. FIG. 8 is a sectional view of a second angular velocity sensor. FIG. 9 is a sectional view of a third angular velocity sensor. FIG. 10 is a sectional view along line A-A in FIG. 2. FIG. 11 is a table showing specifications of the angular velocity sensors. FIG. 12 is a graph showing relationships between an operation temperature range of the respective angular velocity sensors and vibration modes of the cap. FIG. 13 is a sectional view showing resonation modes of the cap. FIG. 14 is a graph showing relationships between the operation temperature range of the respective angular velocity sensors and vibration modes of the cap.

An electronic device 1 shown in FIGS. 1 to 3 has a QFP (Quad Flat Package) structure. Further, the electronic device 1 includes a substrate 2, a first angular velocity sensor 3*z* as a first electronic component mounted on an upper surface 21 of the substrate 2, a second angular velocity sensor 3*x* as a second electronic component, and a third angular velocity sensor 3*y* as a third electronic component, a cap 10 placed on the substrate 2 to cover the first, second, third angular velocity sensors 3*z*, 3*x*, 3*y*, a fourth electronic component 6 mounted on a lower surface 22 of the substrate 2, a lead group 7 extending from the substrate 2, and a mold portion 9 mold-sealing the fourth electronic component 6 and joining the cap 10 to the substrate 2.

Substrate 2

The substrate 2 has a nearly square plate shape in a plan view and has the upper surface 21 and the lower surface 22 having a front-back relation with each other. The substrate 2 is a ceramic substrate and formed using various ceramic materials such as alumina and titania. Thereby, the substrate 2 having a higher corrosion resistance and a higher mechanical strength is obtained. Further, the substrate has a resistance to moisture absorption and a higher heat resistance and, for example, is hard to be damaged by heat applied in the manufacture of the electronic device 1. For example, the substrate 2 is manufactured by stacking of a plurality of ceramic sheets (green sheets) with predetermined wiring patterns formed thereon and sintering of the stacked structure. Note that the substrate 2 is not limited to the ceramic substrate, but e.g., various semiconductor substrates, various glass substrates, various printed boards, etc. may be used.

As shown in FIG. 2, on the upper surface 21, terminals P3*z* electrically coupled to the first angular velocity sensor 3*z*, terminals P3*x* electrically coupled to the second angular velocity sensor 3*x*, and terminals P3*y* electrically coupled to the third angular velocity sensor 3*y* are formed. On the other hand, as shown in FIG. 3, on the lower surface 22, terminals P6 electrically coupled to the fourth electronic component 6 and terminals P7 electrically coupled to the lead group 7 are formed. These respective terminals P3*z*, P3*x*, P3*y*, P6, P7 are electrically coupled via wires (not shown) formed on the substrate 2.

First, Second, Third Angular Velocity Sensors 3*z*, 3*x*, 3*y*

The first, second, third angular velocity sensors 3*z*, 3*x*, 3*y* are respectively mounted on the upper surface 21 of the substrate 2. Further, the first, second, third angular velocity sensors 3*z*, 3*x*, 3*y* are respectively packaged surface-mounted components. Thereby, a higher mechanical strength than mounted components with exposed elements may be exerted. Further, mounting of the first, second, third angular velocity sensors 3*z*, 3*x*, 3*y* on the substrate 2 is easier.

The first angular velocity sensor 3*z* detects an angular velocity around the Z-axis, the second angular velocity sensor 3*x* detects an angular velocity around the X-axis, and the third angular velocity sensor 3*y* detects an angular velocity around the Y-axis. These first, second, third angular velocity sensors 3*z*, 3*x*, 3*y* respectively have the same basic configuration except that vibration frequencies of vibrator elements 34, which will be described later, are different, and are placed so that attitudes may be orthogonal to one another with detection axes directed along the X-axis, the Y-axis, and the Z-axis.

Each of the first, second, third angular velocity sensors 3*z*, 3*x*, 3*y* has a package 31 and the vibrator element 34 housed in the package 31. The package 31 has a recessed portion and includes a box-shaped base 32 supporting the vibrator element 34 housed in the recessed portion, and a lid 33 joined to the base 32 to close the opening of the recessed portion. On the base 32, coupling terminals 39 electrically coupled to the vibrator element 34 are formed. The base 32 is formed using a ceramic material such as alumina or titania and the lid 33 is formed using a metal material such as kovar. Thereby, a difference in coefficient of linear expansion between the base 32 and the lid 33 is smaller and generation of thermal stress may be effectively suppressed.

For example, the vibrator element 34 is a quartz crystal vibrator element having a drive arm and a vibrating arm. In the quartz crystal vibrator element, when an angular velocity around a detection axis is applied while a drive signal is applied and the drive arm is driven and vibrated, a detection vibration is excited in a detection arm by a Coriolis force. Then, electric charge generated in the detection arm by the detection vibration is extracted as a detection signal and the angular velocity may be obtained based on the extracted detection signal.

The configuration of the vibrator element 34 is not particularly limited, but the vibrator element 34 of the embodiment has the configuration shown in FIG. 4. Note that, in FIG. 4, the A-axis, the B-axis, and the C-axis as the three axes orthogonal to one another are shown. The vibrator element 34 includes a base portion 341 located in the center part, a pair of detection vibration arms 342, 343 extending from the base portion 341 toward both sides in the B-axis direction, a pair of supporting arms 344, 345 extending from the base portion 341 toward both sides in the A-axis direction, a pair of drive vibration arms 346, 347 extending from an end of one supporting arm 344 toward both sides in the B-axis direction, and a pair of drive vibration arms 348, 349 extending from an end of the other supporting arm 345 toward both sides in the B-axis direction. The vibrator element 34 is supported by the base 32 in the base portion 341.

Further, the vibrator element 34 includes first detection signal electrodes 351 placed on both principal surfaces of the detection vibration arm 342, first detection ground electrodes 352 placed on both side surfaces of the detection vibration arm 342, second detection signal electrodes 353 placed on both principal surfaces of the detection vibration arm 343, second detection ground electrodes 354 placed on both side surfaces of the detection vibration arm 343, drive signal electrodes 355 placed on both principal side surfaces of the drive vibration arms 346, 347 and both side surfaces of the drive vibration arms 348, 349, and drive ground electrodes 356 placed on both side surfaces of the drive vibration arms 346, 347 and both principal surfaces of the drive vibration arms 348, 349.

When drive signals are applied between the drive signal electrodes 355 and the drive ground electrodes 356, as shown in FIG. 5, the drive vibration arms 346, 347 and the drive vibration arms 348, 349 flexurally vibrate oppositely in phase in the A-axis directions along the AB-plane (hereinafter, this state is also referred to as "drive vibration mode"). In the state, the vibrations of the drive vibration arms 346, 347, 348, 349 are cancelled out and the detection vibration arms 342, 343 do not substantially vibrate. When an angular velocity wc around the C-axis is applied to the vibrator element 34 while driven in the drive vibration mode, as shown in FIG. 6, a Coriolis force acts on the drive vibration arms 346, 347, 348, 349 and flexural vibrations in the A-axis directions are excited and the detection vibration arms 342, 343 flexurally vibrate in the B-axis directions in response to the flexural vibrations (hereinafter, this state is also referred to as "detection vibration mode").

Electric charge generated in the detection vibration arm 342 by the flexural vibration is extracted as a first output signal from the first detection signal electrodes 351, electric charge generated in the detection vibration arm 343 is extracted as a second output signal from the second detection signal electrodes 353, and the angular velocity ωc is obtained based on these first, second output signals.

As above, the configurations of the first, second, third angular velocity sensors 3*z*, 3*x*, 3*y* are collectively explained. As shown in FIG. 7, the first angular velocity sensor 3z is placed with the C-axis along the Z-axis. Accordingly, the vibrator element 34 vibrates along a first plane F1 as an XY-plane along the substrate 2. Further, the first angular velocity sensor 3z is joined to the upper surface 21 of the substrate 2 via a plurality of conductive joint members B3z on the bottom surface of the base 32. The respective coupling terminals 39 are electrically coupled to the predetermined terminals P3z via the joint members B3z.

As shown in FIG. 8, the second angular velocity sensor 3x is placed with the C-axis along the X-axis. Accordingly, the vibrator element 34 vibrates along a second plane F2 as a YZ-plane crossing the first plane F1. Further, the second angular velocity sensor 3x is joined to the upper surface 21 of the substrate 2 via a plurality of conductive joint members B3x on the side surface of the base 32. The respective coupling terminals 39 are electrically coupled to the predetermined terminals P3x via the joint members B3x.

As shown in FIG. 9, the third angular velocity sensor 3y is placed with the C-axis along the Y-axis. Accordingly, the vibrator element 34 vibrates along a third plane F3 as an XZ-plane crossing the first plane F1 and the second plane F2. Further, the third angular velocity sensor 3y is joined to the upper surface 21 of the substrate 2 via a plurality of conductive joint members B3y on the side surface of the base 32. The respective coupling terminals 39 are electrically coupled to the predetermined terminals P3y via the joint members B3y.

Note that, in the embodiment, the first plane F1, the second plane F2, and the third plane F3 are orthogonal to one another, however, not limited to that. It is only necessary that the planes cross one another.

Hereinafter, as shown in FIGS. 7 to 9, the package 31 of the first angular velocity sensor 3z is also referred to as "first package 31z", the base 32 is also referred to as "first base 32z", the lid 33 is also referred to as "first lid 33z", and the vibrator element 34 is also referred to as "first vibrator element 34z". Further, the package 31 of the second angular velocity sensor 3x is also referred to as "second package 31x", the base 32 is also referred to as "second base 32x", the lid 33 is also referred to as "second lid 33x", and the vibrator element 34 is also referred to as "second vibrator element 34x". Furthermore, the package 31 of the third angular velocity sensor 3y is also referred to as "third package 31y", the base 32 is also referred to as "third base 32y", the lid 33 is also referred to as "third lid 33y", and the vibrator element 34 is also referred to as "third vibrator element 34y".

In the electronic device 1, a vibration frequency fz of the first vibrator element 34z in the drive vibration mode, a vibration frequency fx of the second vibrator element 34x in the drive vibration mode, and a vibration frequency fy of the third vibrator element 34y in the drive vibration mode are different from one another. That is, $fz \neq fx \neq fy$. Thereby, interferences (resonances) among the first, second, third vibrator elements 34z, 34x, 34y are suppressed and lowering of angular velocity detection characteristics may be effectively suppressed.

Cap 10

As shown in FIG. 10, the cap 10 is joined to the upper surface 21 of the substrate 2 and covers the first, second, third angular velocity sensors 3z, 3x, 3y. The cap 10 has a hat shape and includes a base portion 101 having a recessed part opening to the lower surface and an annular flange portion 102 projecting from the lower end part of the base portion 101 toward the outer circumference. The cap 10 is placed on the upper surface 21 of the substrate 2 to house the first, second, third angular velocity sensors 3z, 3x, 3y in the recessed part. The flange portion 102 is joined to the substrate 2 by the mold portion 9. The cap 10 housing the first, second, third angular velocity sensors 3z, 3x, 3y is provided, and thereby, the first, second, third angular velocity sensors 3z, 3x, 3y may be protected from moisture, dust, impact, etc.

Note that, in the embodiment, the interior of the cap 10 is atmospherically sealed, however, not limited to that. For example, the cap may be negative pressure-sealed or positive pressure-sealed, or the air may be replaced by a stable gas such as nitrogen or argon. Or, the cap 10 is not necessarily air-tightly sealed.

Further, the cap 10 has conductivity and is formed using e.g., a metal material. Particularly, in the embodiment, the cap may be formed using Alloy 42 as an iron-nickel alloy. Thereby, a difference in coefficient of linear expansion between the substrate 2 as the ceramic substrate and the cap 10 may be made sufficiently small, and thermal stress due to the difference in coefficient of linear expansion may be effectively suppressed. Therefore, the electronic device 1 having stable characteristics less susceptible to the environment temperature is obtained.

Furthermore, the cap 10 is coupled to the ground (GND) when the electronic device 1 is used. Thereby, the cap 10 functions as a shield shielding external electromagnetic noise and driving of the first, second, third angular velocity sensors 3z, 3x, 3y housed in the cap 10 is further stabilized. Note that the constituent material of the cap 10 is not limited to the alloy 42, but, e.g., a metal material such as an SUS material, various ceramic materials, various resin materials, semiconductor materials such as silicon, various glass materials, etc. may be used.

As described above, the cap 10 is formed using the metal material and the substrate 2, the first base 32z, the second base 32x, and the third base 32y are respectively formed using the ceramic materials. Thereby, the differences in coefficient of linear expansion among these respective parts are smaller and generation of thermal stress may be effectively suppressed. Accordingly, another external force than that to be detected is harder to be applied to the vibrator elements 34z, 34x, 34y, and lowering of the detection accuracy of the electronic device 1 may be effectively suppressed.

Fourth Electronic Component 6

The fourth electronic component 6 is mounted on the lower surface 22 of the substrate 2. The fourth electronic component 6 is mounted on the lower surface 22 of the substrate 2, and thereby, the lower surface 22 of the substrate 2 may be effectively utilized. The fourth electronic component 6 is a packaged surface-mounted component. Thereby, a higher mechanical strength than mounted components with exposed elements may be exerted. Further, mounting of the fourth electronic component 6 on the substrate 2 is easier.

As shown in FIG. 10, the fourth electronic component 6 has a circuit element 5 joined to the lower surface of the substrate 2 and an acceleration sensor 4 joined onto the circuit element 5. Further, the circuit element 5 is electrically coupled to the terminals P6 via bonding wires and the acceleration sensor 4 is electrically coupled to the circuit element 5 via bonding wires.

The acceleration sensor 4 is a three-axis acceleration sensor that may respectively independently detect an acceleration in the X-axis directions, an acceleration in the Y-axis directions, and an acceleration in the Z-axis directions. With the sensor, the electronic device 1 is a six-axis compound sensor that can detect angular velocities around the respective axes of the X-axis, the Y-axis, and the Z-axis and accelerations in the respective axial directions. Accordingly, the electronic device 1 that can be mounted on various electronic components and offers higher convenience and has higher demand is obtained.

The acceleration sensor 4 has a package 41 and acceleration vibrator elements 44, 45, 46 housed in the package 41. The package 41 has a base 42 supporting the acceleration vibrator elements 44, 45, 46, and a lid 43 joined to the base 42 to house the acceleration vibrator elements 44, 45, 46 between the base 42 and itself.

Further, the acceleration vibrator element 44 is an element detecting an acceleration in the X-axis directions, the acceleration vibrator element 45 is an element detecting an acceleration in the Y-axis directions, and the acceleration vibrator element 46 is an element detecting an acceleration in the Z-axis directions. These acceleration vibrator elements 44, 45, 46 are silicon vibrator elements having fixed electrodes fixed to the base 42 and movable electrodes variable relative to the base 42. When an acceleration in the detection axis direction is applied, the movable electrode is displaced relative to the fixed electrode and a capacitance formed between the fixed electrode and the movable electrode changes. Accordingly, changes of the capacitances of the acceleration vibrator elements 44, 45, 46 may be extracted as detection signals and the accelerations in the respective axial directions may be obtained based on the extracted detection signals.

The circuit element 5 is electrically coupled to the first, second, third angular velocity sensors 3*z*, 3*x*, 3*y*, the acceleration sensor 4, and the lead group 7. The circuit element 5 has a control circuit 51 for controlling driving of the first, second, third angular velocity sensors 3*z*, 3*x*, 3*y* and the acceleration sensor 4 and an interface circuit 52 for external communication.

The control circuit 51 independently controls driving of the first, second, third angular velocity sensors 3*z*, 3*x*, 3*y* and the acceleration sensor 4 and independently detects the angular velocities around the respective axes of the X-axis, the Y-axis, and the Z-axis and accelerations in the respective axial directions based on the detection signals output from the first, second, third angular velocity sensors 3*z*, 3*x*, 3*y* and the acceleration sensor 4. The interface circuit 52 transmits and receives signals, receives commands from an external apparatus, and outputs the detected angular velocities and accelerations to the external apparatus.

As above, the fourth electronic component 6 is explained, however, the configuration of the fourth electronic component 6 is not particularly limited. For example, the acceleration sensor 4 may be omitted. In this case, the electronic device 1 functions as a three-axis angular velocity sensor. On the other hand, the circuit element 5 may be omitted. In this case, a circuit having the same function as the circuit element 5 may be provided in an external apparatus on which the electronic device 1 is mounted and the electronic device 1 may be controlled by the circuit. Or, the fourth electronic component 6 may be various sensors detecting things other than the acceleration or may be another component than a sensor. Or, the fourth electronic component 6 may be omitted.

Lead Group 7

As shown in FIGS. 3 and 10, the lead group 7 is located at the lower surface 22 side of the substrate 2 and has a plurality of leads 71 joined to the lower surface 22 of the substrate 2 via conductive joint members B7. The plurality of leads 71 are provided substantially equally along the four sides of the substrate 2. Further, the plurality of leads 71 are electrically coupled to the terminals P7 via the joint members B7.

Mold Portion 9

As shown in FIG. 10, the mold portion 9 molds the fourth electronic component 6 and protects the component from moisture, dust, impact, etc. Further, the mold portion 9 molds the coupling parts between the substrate 2 and the respective leads 71 and mechanically reinforces the parts and protects the parts from moisture, dust, impact, etc. Furthermore, the mold portion 9 joints the cap 10 and the substrate 2. A molding material forming the mold portion 9 is not particularly limited, but e.g., a curable resin material in addition to a thermosetting epoxy resin may be used. The mold portion 9 may be formed by e.g., transfer molding or the like.

As above, the configuration of the electronic device 1 is explained. In the electronic device 1, when the cap 10 resonates with the first, second, third vibrator elements 34*z*, 34*x*, 34*y*, unnecessary vibrations may be generated in the first, second, third vibrator elements 34*z*, 34*x*, 34*y*, zero-point outputs from the first, second, third angular velocity sensors 3*z*, 3*x*, 3*y* may fluctuate, and the detection accuracy of the electronic device 1 may be lower. Note that "zero-point outputs" refer to outputs from the first, second, third angular velocity sensors 3*z*, 3*x*, 3*y* in a rest state without an angular velocity. Accordingly, the electronic device 1 is formed so that the vibration frequencies of the first, second, third vibrator elements 34*z*, 34*x*, 34*y* and the resonance frequency of the cap 10 may be sufficiently apart. As below, this will be explained in detail.

For the electronic device 1, an operation temperature range Ta is set as a range in which the device holds expected functions and normally operates. As shown in FIG. 11, generally, the operation temperature range Ta is written on a packaging box, in product specifications of a user manual of the electronic device 1, or the like. The operation temperature range Ta is not particularly limited, but different depending on the configuration of the electronic device 1. In the embodiment, the operation temperature range Ta=−40° C. to +105° C. is set.

For the electronic device 1, a vibration frequency band Tfz of the first vibrator element 34*z*, a vibration frequency band Tfx of the second vibrator element 34*x*, and a vibration frequency band Tfy of the third vibrator element 34*y* are respectively set. The vibration frequency band Tfz is a frequency band set with reference to the vibration frequency fz of the first vibrator element 34*z* in consideration of the individual difference of the first vibrator element 34*z*. The vibration frequency band Tfx is a frequency band set with reference to the vibration frequency fx of the second vibrator element 34*x* in consideration of the individual difference of the second vibrator element 34*x*. The vibration frequency band Tfy is a frequency band set with reference to the vibration frequency fy of the third vibrator element 34*y* in consideration of the individual difference of the third vibrator element 34*y*. Not particularly limited, but the vibration frequency bands Tfz, Tfx, Tfy are set to about ±0.5% of the vibration frequencies fz, fx, fy, respectively.

Note that, in the embodiment, as shown in FIG. 11, the vibration frequency fz of the first vibrator element 34*z* is fz=49.575 kHz and the vibration frequency band Tfz=49.000 kHz to 50.150 kHz. The vibration frequency fx of the second vibrator element 34*x* is fx=51.025 kHz and the vibration frequency band Tfx=50.450 kHz to 51.600 kHz. The vibration frequency fy of the third vibrator element 34*y* is fy=53.550 kHz and the vibration frequency band Tfy=52.900 kHz to 54.200 kHz.

As described above, the vibration frequency bands Tfz, Tfx, Tfy are set not to overlap with one another. Thereby, interferences (resonances) among the first, second, third vibrator elements 34z, 34x, 34y are suppressed. Accordingly, unnecessary vibrations are harder to be generated in the first, second, third vibrator elements 34z, 34x, 34y and the fluctuations of the zero-point outputs are suppressed. Therefore, lowering of the detection accuracy of the electronic device 1 may be effectively suppressed.

Further, the cap 10 has at least one resonance mode. In the embodiment, as shown in FIG. 12, the cap 10 has seven resonance modes M1, M2, M3, M4, M5, M6, M7. Here, the types and the number of the resonance modes of the cap 10 are not particularly limited. Hereinafter, the resonance frequency of the resonance mode M1 is fm1, the resonance frequency of the resonance mode M2 is fm2, the resonance frequency of the resonance mode M3 is fm3, the resonance frequency of the resonance mode M4 is fm4, the resonance frequency of the resonance mode M5 is fm5, the resonance frequency of the resonance mode M6 is fm6, and the resonance frequency of the resonance mode M7 is fm7. Note that these resonance frequencies fm1 to fm7 respectively have temperature dependencies and, for example, change depending on the temperature of the electronic device 1.

In the electronic device 1, the resonance frequencies fm1 to fm7 are not within the vibration frequency band Tfz, the vibration frequency band Tfx, and the vibration frequency band Tfy within the operation temperature range Ta. That is, at all temperatures within the operation temperature range Ta, the resonance frequencies fm1 to fm7 are respectively located outside of the vibration frequency band Tfz, the vibration frequency band Tfx, and the vibration frequency band Tfy. Thereby, the first, second, third vibrator elements 34z, 34x, 34y and the cap 10 are harder to resonate. Accordingly, unnecessary vibrations generated in the first, second, third vibrator elements 34z, 34x, 34y due to the resonance with the cap 10 may be suppressed. Therefore, temperature drifts of the zero-point outputs of the first, second, third angular velocity sensors 3z, 3x, 3y, i.e., fluctuations of the zero-point outputs with temperature changes are suppressed, and excellent angular velocity detection characteristics may be exerted.

Note that, as shown in FIG. 13, in the resonance modes M1 to M7 of the cap 10, respectively, a top plate part 101a forming the bottom part of the base portion 101 vibrates in the thickness directions, i.e., the Z-axis directions. This vibration tends to generate unnecessary vibrations particularly in the second, third vibrator elements 34x, 34y of the three vibrator elements 34z, 34x, 34y. This is because the C-axis as the detection axis of the second vibrator element 34x is directed in the X-axis directions and the C-axis as the detection axis of the third vibrator element 34y is directed in the Y-axis directions and, when the top plate part 101a vibrates in the thickness directions in the resonance mode, the respective detection axes swing in the Z-axis directions due to the vibration and the vibrations of the second, third vibrator elements 34x, 34y become unstable with the swing. On the other hand, the detection axis of the first vibrator element 34z is directed in the Z-axis directions. Accordingly, even when the top plate part 101a vibrates in the thickness directions in the resonance mode, the C-axis as the detection axis of the first vibrator element 34z does not swing. Therefore, the first vibrator element 34z is less susceptible to the vibration of the cap 10 than the second, third vibrator elements 34x, 34y.

On this account, in the embodiment, the resonance frequencies fm1 to fm7 of the cap 10 are not within the vibration frequency band Tfz, the vibration frequency band Tfx, and the vibration frequency band Tfy within the operation temperature range Ta, however, the configuration is not limited to that. As shown in FIG. 14, it is only necessary that at least the resonance frequencies fm1 to fm7 of the cap 10 are not within the vibration frequency band Tfx and the vibration frequency band Tfy. According to the configuration, the fluctuations of the zero-point outputs of the respective angular velocity sensors 3z, 3x, 3y may be effectively suppressed. Further, compared to the embodiment, the settable range of the resonance frequencies fm1 to fm7 is wider and the design of the cap 10 is easier.

A method of adjusting the resonance frequency of the cap 10 is not particularly limited, but includes e.g., a method of changing the thickness of the cap 10. Generally, the larger the thickness, the higher the resonance frequencies fm1 to fm7 in the respective resonance modes M1 to M7. Or, the resonance frequency of the cap 10 may be adjusted by changing of the dimension of the cap 10. Generally, the smaller the dimension, the higher the resonance frequencies fm1 to fm7 in the respective resonance modes M1 to M7. Or, the resonance frequency of the cap 10 may be changed by selection of the constituent material of the cap 10. In the selection of the constituent material, for example, it is preferable to select a material having a resonance frequency at +13% or more of the highest vibration frequency fy of the vibration frequencies fz, fx, fy.

For example, the resonance frequencies fm1 to fm7 of the cap 10 not within the vibration frequency band Tfz, the vibration frequency band Tfx, and the vibration frequency band Tfy within the operation temperature range Ta may be checked in the following manner. For example, when the operating temperature of the electronic device 1 is changed within the operation temperature range Ta while the respective vibrator elements 34z, 34x, 34y are driven, if no significant change such as dip is not caused in the detection signals of the respective vibrator elements 34z, 34x, 34y, the resonance frequencies fm1 to fm7 of the cap 10 not within the vibration frequency band Tfz, the vibration frequency band Tfx, and the vibration frequency band Tfy within the operation temperature range Ta may be estimated. Alternatively, the resonance mode of the cap 10 at a normal temperature and the frequency thereof are detected using a laser doppler measuring instrument and frequency changes in the respective resonance modes within the operation temperature range Ta are estimated by a simulation based on the results, experimental data, or the like, and if the estimation result is outside of the vibration frequency bands Tfz, Tfx, Tfy, the resonance frequencies fm1 to fm7 of the cap 10 not within the vibration frequency bands Tfz, Tfx, Tfy may be estimated.

As above, the electronic device 1 is explained. As described above, the electronic device 1 includes the substrate 2, the first angular velocity sensor 3z as the first electronic component mounted on the substrate 2 and having the first vibrator element 34z vibrating along the first plane F1 along the substrate 2, the second angular velocity sensor 3x as the second electronic component mounted on the substrate 2 and having the second vibrator element 34x vibrating along the second plane F2 crossing the first plane F1, the third angular velocity sensor 3y as the third electronic component mounted on the substrate 2 and having the third vibrator element 34y vibrating along the third plane F3 crossing the first plane F1 and the second plane F2, and the cap 10 mounted on the substrate 2 and covering the first angular velocity sensor 3*z*, the second angular velocity sensor 3*x*, and the third angular velocity sensor 3*y*. Further, the resonance modes M1 to M7 of the cap 10 are not within the vibration frequency bands Tfx, Tfy of the second vibrator element 34*x* and the third vibrator element 34*y* in the operation temperature range Ta. Thereby, the second, third vibrator elements 34*x*, 34*y* and the cap 10 are harder to resonate. Accordingly, unnecessary vibrations generated in the second, third vibrator elements 34*x*, 34*y* may be suppressed. Therefore, fluctuations of the zero-point outputs within the operation temperature range Ta are suppressed, and lowering of temperature drift characteristics of the electronic device 1 may be effectively suppressed.

As described above, the electronic device 1 does not have the resonance modes M1 to M7 of the cap 10 within the vibration frequency band Tfz of the first vibrator element 34*z* in the operation temperature range Ta. Thereby, the first vibrator element 34*z* and the cap 10 are harder to resonate. Accordingly, unnecessary vibrations generated in the first vibrator element 34*z* due to a resonance with the cap 10 may be suppressed. Therefore, fluctuations of the zero-point outputs within the operation temperature range Ta are suppressed, and lowering of temperature drift characteristics of the electronic device 1 may be effectively suppressed.

As described above, the first vibrator element 34*z*, the second vibrator element 34*x*, and the third vibrator element 34*y* have the different vibration frequencies fz, fx, fy from one another. That is, fz≠fx≠fy. Thereby, interferences among the first, second, third vibrator elements 34*z*, 34*x*, 34*y* are suppressed. That is, an unnecessary vibration generated in one vibrator element due to a vibration of another vibrator element may be suppressed. Therefore, fluctuations of the zero-point outputs are suppressed, and excellent angular velocity detection characteristics may be exerted.

As described above, the first angular velocity sensor 3*z* includes the first base 32*z* and the first lid 33*z* and has the first package 31*z* housing the first vibrator element 34*z* inside, the second angular velocity sensor 3*x* includes the second base 32*x* and the second lid 33*x* and has the second package 31*x* housing the second vibrator element 34*x* inside, and the third angular velocity sensor 3*y* includes the third base 32*y* and the third lid 33*y* and has the third package 31*y* housing the third vibrator element 34*y* inside. Further, the cap 10 is formed using the metal material and the substrate 2, the first base 32*z*, the second base 32*x*, and the third base 32*y* are respectively formed using the ceramic materials. Thereby, the differences in coefficient of linear expansion of these respective parts are smaller and generation of thermal stress may be effectively suppressed. Accordingly, another external force than that to be detected is harder to be applied to the vibrator elements 34*z*, 34*x*, 34*y*, and lowering of the detection accuracy of the electronic device 1 may be effectively suppressed.

As described above, the substrate 2 has the upper surface 21 as a first surface and the lower surface 22 as a second surface in the front-back relation, and the first angular velocity sensor 3*z*, the second angular velocity sensor 3*x*, and the third angular velocity sensor 3*y* are mounted on the upper surface 21. Further, the electronic device 1 includes the fourth electronic component 6 mounted on the lower surface 22 and the leads 71 extending from the substrate 2 toward the lower surface 22 side. Thereby, the lower surface 22 of the substrate 2 may be effectively utilized. Particularly, as in the embodiment, the acceleration sensor 4 is mounted as the fourth electronic component 6, and thereby, the electronic device 1 may be the six-axis compound sensor and the convenience of the electronic device 1 is increased.

Second Embodiment

Figure 15:
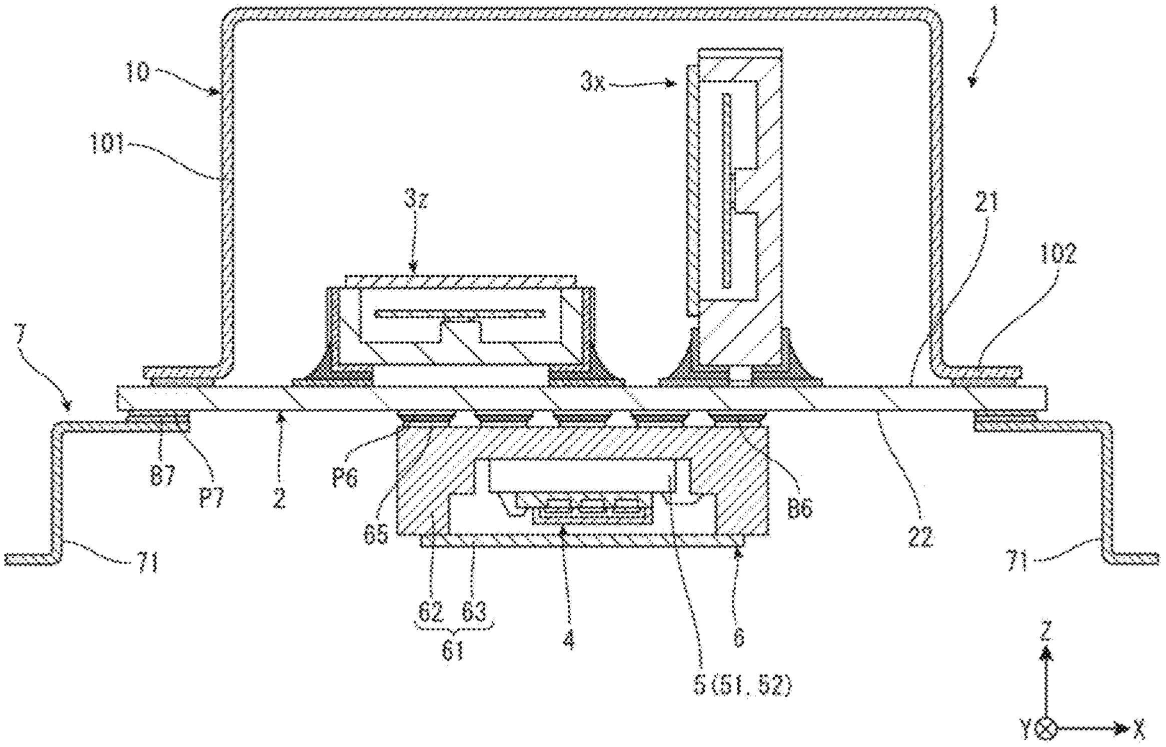
FIG. 15 is a sectional view showing an electronic device according to a second embodiment.

FIG. 15 is a sectional view showing an electronic device according to a second embodiment.

The electronic device 1 of the embodiment is the same as that of the above described first embodiment except that the mold portion 9 is omitted and the configuration of the fourth electronic component 6 is different. Note that, in the following description, the embodiment will be explained with a focus on the differences from the above described embodiment and the explanation of the same items will be omitted. Further, in the drawing of the embodiment, the same configurations as those of the above described embodiment have the same signs.

As shown in FIG. 15, in the electronic device 1 of the embodiment, the mold portion 9 is omitted and the fourth electronic component 6 is exposed compared to the above described first embodiment. Instead, the fourth electronic component 6 is a packaged surface-mounted component and has a package 61 housing the acceleration sensor 4 and the circuit element 5 that are exposed in the above described first embodiment.

The package 61 has a box-shaped base 62 having a recessed portion and a lid 63 joined to the base 62 to close the opening of the recessed portion. The base 62 is formed using a ceramic material such as alumina or titania and the lid 63 is formed using a metal material such as kovar. As described above, the acceleration sensor 4 and the circuit element 5 are housed in the package 61, and thereby, the acceleration sensor 4 and the circuit element 5 are not exposed and these may be protected.

The fourth electronic component 6 is joined to the lower surface 22 of the substrate 2 via conductive joint members B6 on the bottom surface of the package 61. Terminals 65 electrically coupled to the circuit element 5 are formed on the bottom surface of the package 61, and the terminals 65 are electrically coupled to the terminals P6 via the joint members B6.

The cap 10 is joined to the upper surface 21 of the substrate 2 via a joint member in the flange portion 102.

According to the second embodiment as well, the same effects as those of the above described first embodiment may be exerted.

As above, the electronic device of the present disclosure is explained based on the illustrated embodiments, however, the present disclosure is not limited to those. The configurations of the respective parts may be replaced by any configurations having the same functions. Further, any other configuration may be added to the present disclosure.

What is claimed is:

1. An electronic device comprising:
  - a substrate having first and second surfaces facing outwardly opposite to each other;
  - a first electronic component mounted on the first surface of the substrate and including a first angular velocity sensor vibrating along a first plane along the substrate within a first frequency band in an operation temperature range,
  - the first angular velocity sensor detecting a first angular velocity around a first direction;
  - a second electronic component mounted on the first surface of the substrate and including a second angular velocity sensor vibrating along a second plane crossing the first plane within a second frequency band in the operation temperature range, the second angular velocity sensor detecting a second angular velocity around a second direction perpendicular to the first direction;

a third electronic component mounted on the first surface of the substrate and including a third angular velocity sensor vibrating along a third plane crossing the first plane and the second plane within a third frequency band in the operation temperature range, the third angular velocity sensor detecting a third angular velocity around a third direction perpendicular to each of the first and second directions;

a cap mounted on a periphery of the first surface of the substrate and covering the first electronic component, the second electronic component, and the third electronic component, the cap being made of an iron-nickel alloy having a plurality of resonance modes due to different frequencies and different temperatures, the cap being electrically connected to a ground potential;

a fourth electronic component mounted on the second surface of the substrate and including a first acceleration sensor, the first acceleration sensor detecting accelerations along the first, second, and third directions; and a mold covering an entirety of the fourth electronic component and the second surface of the substrate, the mold joining a periphery of the cap to the periphery of the first surface of the substrate, wherein the first, second, and third frequency bands are different from one another and adjacent to one another with a plurality of gap bands therebetween, and frequencies of the plurality of resonance modes of the cap are within the plurality of gap bands, over a maximum value of the first and second or third frequency bands, and below a minimum value of the second and third frequency bands.

2. The electronic device according to claim 1, wherein the first electronic component includes a first base and a first lid and has a first package housing the first vibrator element inside, the second electronic component includes a second base and a second lid and has a second package housing the second vibrator element inside, the third electronic component includes a third base and a third lid and has a third package housing the third vibrator element inside, and the substrate, the first base, the second base, and the third base are respectively formed using ceramic materials.

3. The electronic device according to claim 1, further comprising:

a lead extending from the substrate, wherein the lead has a first end part and a second end part opposite to each other, the first end part is fixed to a periphery of the second surface of the substrate, and the second end part is located away from an outer edge of the substrate.

* * * * *